United States Patent [19]

Jeong

[11] Patent Number: 5,658,817

[45] Date of Patent: Aug. 19, 1997

[54] METHOD FOR FABRICATING STACKED CAPACITORS OF SEMICONDUCTOR DEVICE

[75] Inventor: Ha Poong Jeong, Kyoungki-do, Rep. of Korea

[73] Assignee: Hyundai Electronics Industries Co., Ltd., Kyoungki-do, Rep. of Korea

[21] Appl. No.: 587,791

[22] Filed: Dec. 26, 1995

[30] Foreign Application Priority Data

Dec. 31, 1994 [KR] Rep. of Korea ............... 94-40526

[51] Int. Cl.⁶ ............... H01L 21/70; H01L 27/00
[52] U.S. Cl. ............... 438/397
[58] Field of Search ............... 437/60, 52, 919

[56] References Cited

U.S. PATENT DOCUMENTS

| | | | |
|---|---|---|---|
| 5,236,859 | 8/1993 | Bae | 437/52 |
| 5,248,628 | 9/1993 | Okabe et al. | 437/47 |
| 5,284,787 | 2/1994 | Ahn | 437/52 |

Primary Examiner—Jey Tsai
Attorney, Agent, or Firm—Reid & Priest LLP

[57] ABSTRACT

A method for fabricating capacitors of a semiconductor device capable of forming a capacitor structure providing a higher capacitance than the conventional pin-shaped structure. The method includes forming a lower insulating layer over a semiconductor substrate, forming a contact hole in the lower insulating layer, forming a first conduction layer over the resulting structure, etching the first conduction layer and the lower insulating layer at a desired region to a desired depth of the lower insulating layer, thereby forming a groove, sequentially forming a second conduction layer and a sacrificial film over the resulting structure, anisotropically etching the sacrificial film by use of said contact mask at a region where it fills the contact hole, forming a third conduction layer over the resulting structure, anisotropically etching the third conduction layer, the sacrificial film and the second conduction layer at a region where they fill the groove, forming, on side walls of the groove, spacers comprised of the portions of the second conduction layer left on the side walls of the groove, respectively, and removing the sacrificial film, thereby forming storage electrodes having an increased surface area.

6 Claims, 3 Drawing Sheets

METHOD FOR FABRICATING STACKED CAPACITORS OF SEMICONDUCTOR DEVICE

BACKGROUND OF THE INVENTION

1. Field of the Invention

The present invention relates to a method for fabricating capacitors of a semiconductor device, and more particularly to a method for fabricating capacitors having an increased storage electrode surface area to enable the fabrication of highly integrated semiconductor devices.

2. Description of the Prior Art

The recent high integration trend of semiconductor devices inevitably involves a reduction in cell dimension. However, such a reduction in cell dimension results in a difficulty to form capacitors having a sufficient capacitance. This is because the capacitance is proportional to the surface area of the capacitor. In a case of a dynamic random access memory (DRAM) device constituted by one metal oxide semiconductor (MOS) transistor and one capacitor, in particular, it is important to reduce the area occupied by the capacitor and yet obtain a high capacitance of the capacitor, for the high integration of the DRAM device.

For increasing the capacitance, various research has been conducted. For example, there have been known use of a dielectric material exhibiting a high dielectric constant, formation of a thin dielectric film, and formation of capacitors having an increased surface area, taking into consideration the fact that the capacitance of the capacitor is proportional to the area of the capacitor and inversely proportional to the thickness of the dielectric film constituting the capacitor.

However, all of these methods have their own problems. Although various materials, such as $Ta_2O_5$, $TiO_2$ or $SrTiO_3$, have been proposed as the dielectric material exhibiting a high dielectric constant, their reliance and thin film characteristics have not been confirmed. For this reason, it is difficult to use such dielectric materials for semiconductor devices in practical situations. The reduction in the thickness of dielectric film results in damage to the dielectric film severely affecting the reliance of the capacitor.

In order to increase the surface area of the capacitor, various capacitor structures have also been proposed. They include a pin structure extending throughout a multi-layer polysilicon structure to connect the layers with one another, a labyrinthine structure with a cylindrical or rectangular shape, and a structure having hemispherical grains of silicon on a storage electrode surface. In these capacitor structures, however, the capacitance is still insufficient because the surface area of the capacitor is still small due to its reduction caused by the high integration of DRAM.

Now, a capacitor having the pin structure will be described in conjunction with FIGS. 1A to 1C respectively illustrating sequential steps of a conventional method for fabricating a semiconductor device.

In accordance with this method, a semiconductor substrate 31 is prepared and then metal oxide semiconductor (MOS) transistor structures are formed on the semiconductor substrate 31, as shown in FIG. 1A. Each MOS transistor structure includes an element-isolating oxide film 32, a gate oxide film 33, a gate electrode 34 and an impurity-diffused region 35. Thereafter, an interlayer insulating film 36 and a bit line 37 are formed. Over the resulting structure, a lower insulating layer 38 is then formed. The bit line 37 may be formed after forming the capacitor. A desired portion of the lower insulating layer 38 is then etched using a contact mask (not shown), thereby forming a contact hole 39. Over the resulting structure, a first polysilicon film 40 and an oxide film 41 are sequentially formed.

The oxide film 41 is also called a sacrificial film because it is removed after the formation of a storage electrode (not shown). The first polysilicon film 40 is a conduction layer made of polycide or the like.

Using a contact mask (not shown), the portion of the oxide film 41 disposed in the contact hole 39 is then anisotropically etched so that the first polysilicon film 40 will be exposed at its desired portion, as shown in FIG. 1B. Over the resulting structure, a second polysilicon film 42 is then formed to a desired thickness.

The second polysilicon film 42 is a conduction layer made of polycide or the like.

Subsequently, the second polysilicon film 42, oxide film 41 and first polysilicon film 40 are partially etched in a sequential manner using a storage electrode mask (not shown), as shown in FIG. 1C. At this etching step using the storage electrode mask, the lower insulating layer 38 is used as an etch barrier layer. The oxide film 41 is then completely removed in accordance with a wet etch method using the difference of the etch selectivity ratio between the first and second polysilicon films 40 and 42, thereby forming a pin-shaped storage electrode.

Although this pin-shaped storage electrode fabricated in accordance with the above-mentioned method has an improvement in topology, as compared to other type capacitors, this method involves a difficulty to ensure a sufficient capacitance for highly integrated semiconductor devices.

SUMMARY OF THE INVENTION

Therefore, an object of the invention is to provide a method for fabricating capacitors of a semiconductor device capable of forming a capacitor structure providing a higher capacitance than the conventional pin-shaped structure while still using the masks conventionally used to form patterns.

In accordance with the present invention, this object is accomplished by providing a method for fabricating capacitors of a semiconductor device comprising the steps of: forming a lower insulating layer over a semiconductor substrate; forming a contact hole in the lower insulating layer by use of a contact mask; forming a first conduction layer over the resulting structure obtained after the formation of the contact hole; etching the first conduction layer and the lower insulating layer at a desired region to a desired depth of the lower insulating layer by use of a storage electrode mask, thereby forming a groove; sequentially forming a second conduction layer and a sacrificial film over the resulting structure obtained after the etching; anisotropically etching the sacrificial film by use of said contact mask; forming a third conduction layer over the resulting structure obtained after the anisotropic etching; anisotropically etching the third conduction layer, the sacrificial film and the second conduction layer by use of said storage electrode mask at a region where they fill the groove; forming spacers comprised of a conduction layer on side walls of the groove, respectively; and removing the sacrificial film, thereby forming storage electrodes having an increased surface area.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 2A to 2E illustrate a method for fabricating capacitors of a semiconductor device in accordance with an embodiment of the present invention.

Figure 1A:
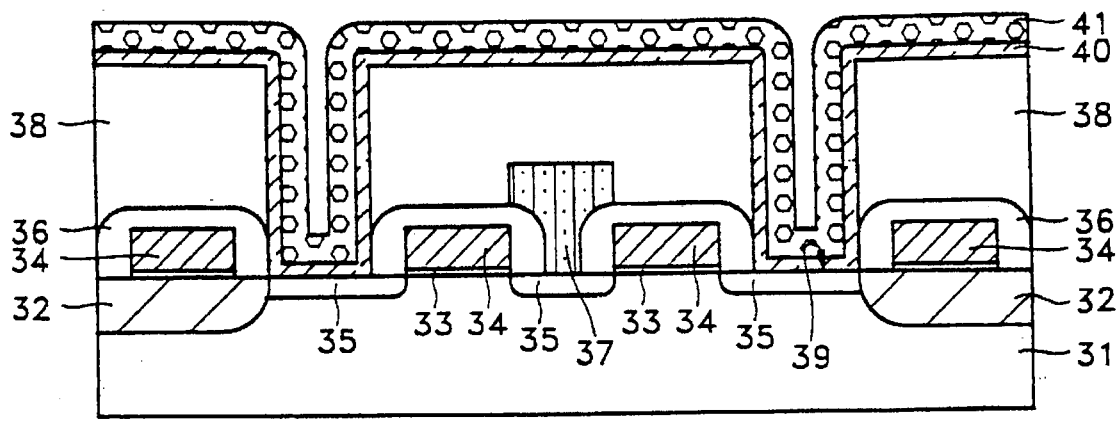
FIGS. 1A to 1C are sectional views respectively illustrating a conventional method for fabricating capacitors of a semiconductor device.
Figure 1B:
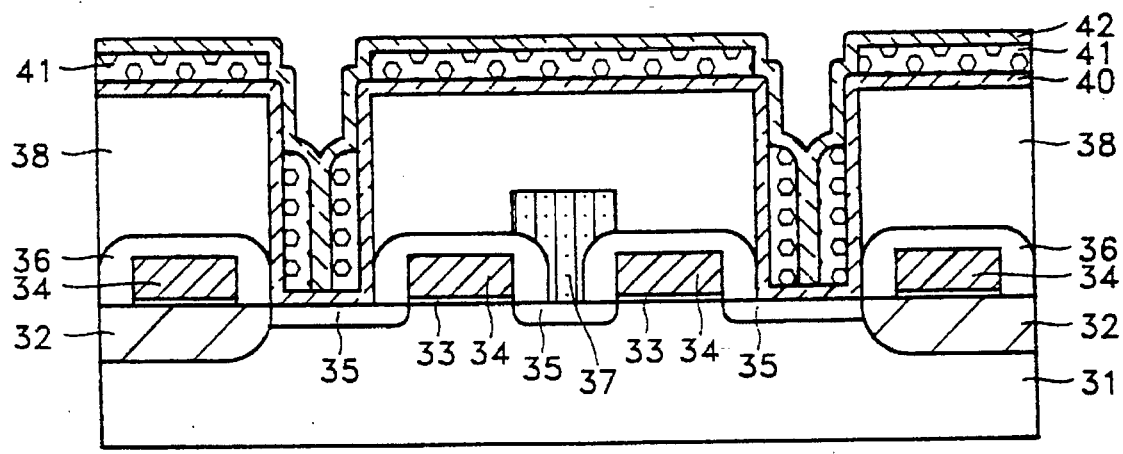
Figure 1C:
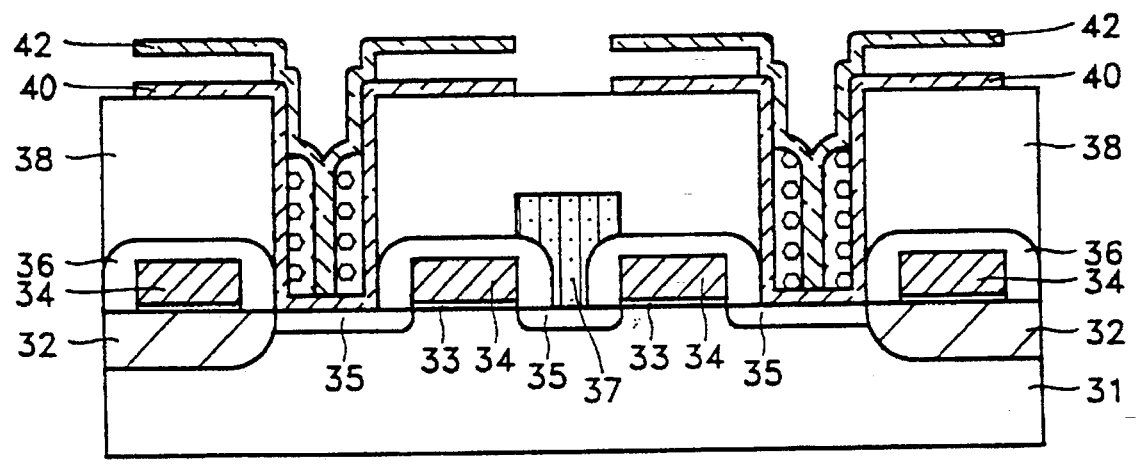
Figure 2A:
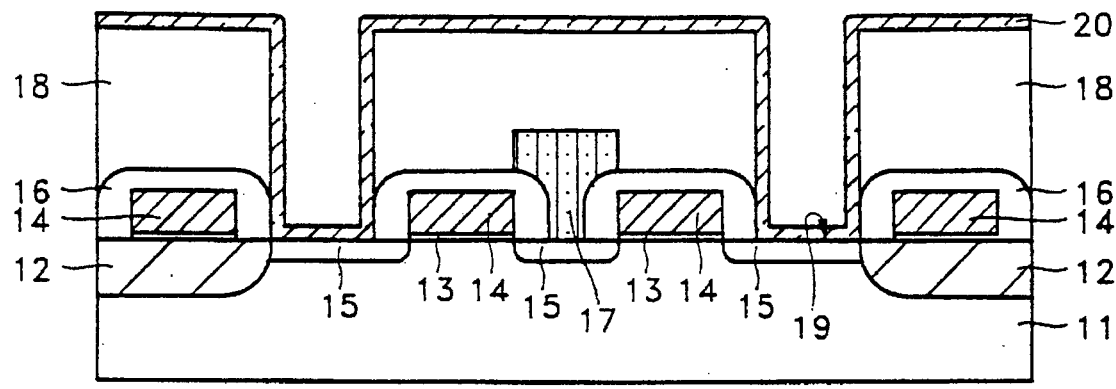
FIGS. 2A to 2E are sectional views respectively illustrating a method for fabricating capacitors of a semiconductor device in accordance with the present invention.

In accordance with the method of the present invention, a semiconductor substrate 11 is prepared and then the MOS transistor structures are formed on the semiconductor substrate 11, as shown in FIG. 2A. Each MOS transistor structure includes an element-isolating oxide film 12, a gate oxide film 13, a gate electrode 14 and an impurity-diffused region 15. Thereafter, an interlayer insulating film 16 and a bit line 17 are formed. Over the resulting structure, a lower insulating layer 18 is then formed. The bit line 17 may be formed after forming the capacitor. A desired portion of the lower insulating layer 18 is then etched using a contact mask (not shown), thereby forming a contact hole 19. Over the resulting structure, a first polysilicon film 20 is then formed which is in contact with all surfaces of the contact hole 19. The first polysilicon film 20 is a conduction layer made of polycide or the like.

Figure 2B:
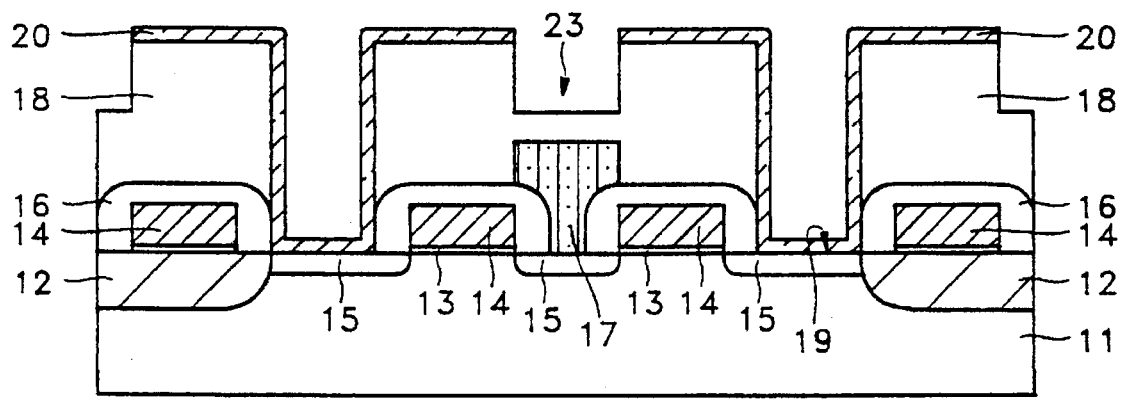

As shown in FIG. 2B, the first polysilicon film 20 and lower insulating layer 18 are partially etched at a desired region to a desired depth using a storage electrode mask (not shown). As a result, a groove 23 is formed in the lower insulating layer 18. The formation of the groove 23 is carried out such that the under layers formed prior to the formation of the lower insulating layer 18 are not exposed through the groove 23.

Figure 2C:
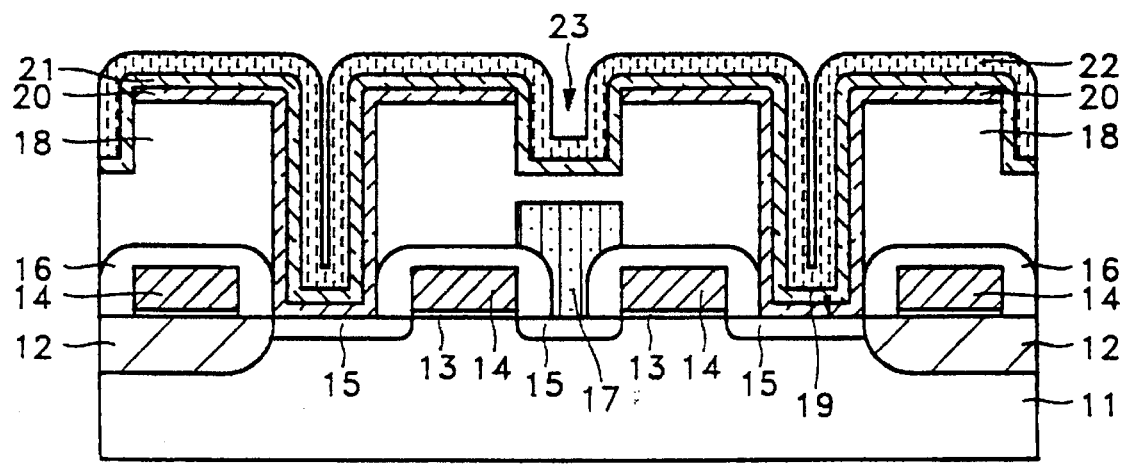

Over the resulting structure, a second polysilicon film 21 is then formed, as shown in FIG. 2C. The second polysilicon film 21 is a conduction layer made of polycide or the like. An oxide film 22 is then formed over the resulting structure. The oxide film 22 is also called a sacrificial film because it is removed after the formation of a storage electrode (not shown).

Figure 2D:
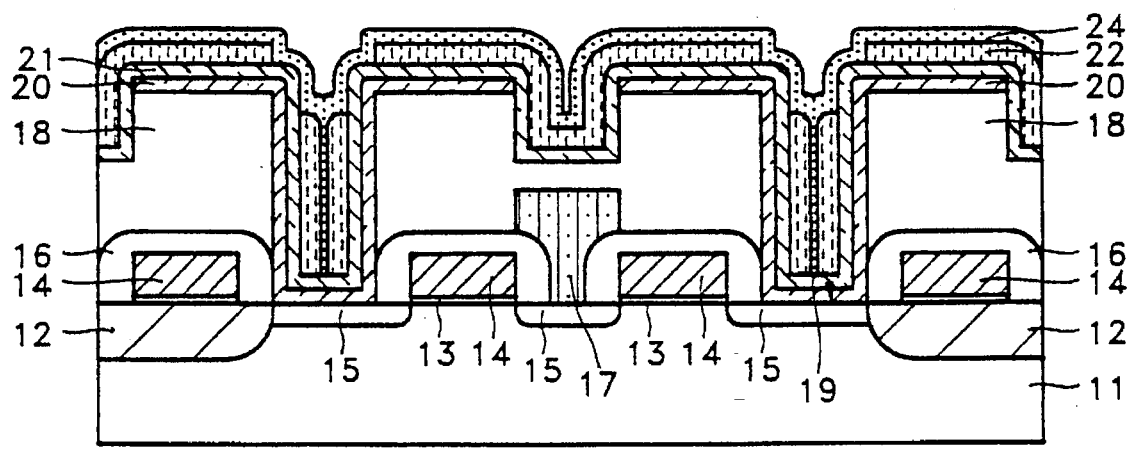

Using a contact mask (not shown), the portion of the oxide film 22 disposed at the upper portion of the contact hole 19 is then anisotropically etched so that the second polysilicon film 21 will be partially exposed at its portion disposed on the upper portion of the contact hole 19, as shown in FIG. 2D. Over the resulting structure, a third polysilicon film 24 is then formed such that it is in contact with the exposed portion of the second polysilicon film 21.

Figure 2E:
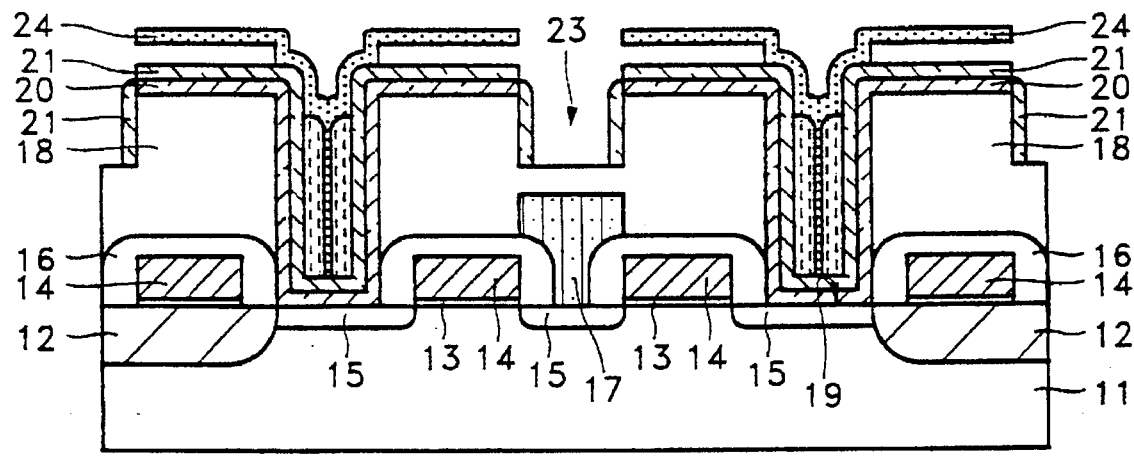

Subsequently, the third polysilicon film 24, oxide film 22 and second polysilicon film 21 are anisotropically etched in a sequential manner using a storage electrode mask (not shown), as shown in FIG. 2E. As a result, spacers are formed on side walls of the groove 23, respectively. The spacers are provided by the portions of the second polysilicon film 21 left on the side walls of the groove 23, respectively. The oxide film 22 disposed between the third polysilicon film 24 and second polysilicon film 21 is then completely removed in accordance with a wet etch method using the difference of the etch selectivity ratio among the first to third polysilicon films 20, 21 and 24. Thus, a pin-shaped storage electrode is obtained which has an increased surface area as compared to that of the conventional structure without increasing the topology.

Over the resulting structure, finally, a dielectric film (not shown) and a plate electrode (not shown) are formed in a sequential manner. Thus, a capacitor is obtained which has a capacitance enough to enable the high integration of semiconductor devices. The dielectric film has a composite layer structure of a nitride layer and an oxide layer or of an oxide layer, a nitride layer, and another oxide layer. On the other hand, the plate electrode is made of polysilicon, polycide or a conduction material similar thereto.

As apparent from the above description, the present invention provides a method for fabricating capacitors of a semiconductor device by forming a groove between neighboring storage electrode regions in accordance with an etching process using a storage electrode mask, forming spacers on side walls of the groove by a conduction layer exhibiting a superior step coverage, and removing an insulating film exposed after completing the etching process, thereby forming storage electrodes having an increased surface area. In accordance with this method, it is possible to form capacitors having a sufficient capacitance to enable the high integration of semiconductor devices. Accordingly, the method of the present invention can fabricate semiconductor devices with a high integration degree and improved reliability.

Although the preferred embodiment of the invention has been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating capacitors of a semiconductor device comprising the steps of:

forming a lower insulating layer over a semiconductor substrate;

forming a contact hole in the lower insulating layer by use of a contact mask;

forming a first conduction layer over the resulting structure obtained after the formation of the contact hole;

etching the first conduction layer and the lower insulating layer at a desired region to a desired depth of the lower insulating layer by use of a storage electrode mask, thereby forming a groove;

sequentially forming a second conduction layer and a sacrificial film over the resulting structure obtained after the etching;

anisotropically etching the sacrificial film by use of said contact mask;

forming a third conduction layer over the resulting structure obtained after the anisotropic etching;

anisotropically etching the third conduction layer, the sacrificial film and the second conduction layer by use of said storage electrode mask at a region where they fill the groove;

forming spacers comprised of a conduction layer on side walls of the groove, respectively; and removing the sacrificial film, thereby forming storage electrodes having an increased surface area.

2. The method in accordance with claim 1, wherein the first to third conduction layers are each comprised of polysilicon films.

3. The method in accordance with claim 1, wherein the groove is formed such that its bottom is vertically spaced from an under layer structure formed beneath the lower insulating layer.

4. The method in accordance with claim 1, wherein the sacrificial film comprises an oxide film.

5. The method in accordance with claim 1, wherein the step of etching the sacrificial film comprises etching a portion of the sacrificial film disposed in the contact hole.

6. The method in accordance with claim 1, wherein the conduction layer constituting each of the spacers is comprised of a portion of the second conviction layer left on each side wall of the groove after carrying out the step of etching the third conduction layer, the sacrificial film and the second conduction layer.

* * * * *